(12) United States Patent
Takagishi et al.

(10) Patent No.: US 7,256,648 B2
(45) Date of Patent: Aug. 14, 2007

(54) VARIABLE FEEDBACK CIRCUITS AND METHODS

(75) Inventors: Hideto Takagishi, San Jose, CA (US); Simon Tsai, Taipei County (TW)

(73) Assignee: PacificTech Microelectronics, Inc., Grand Cayman (KY)

( * ) Notice: Subject to any disclaimer, the term of this patent is extended or adjusted under 35 U.S.C. 154(b) by 106 days.

(21) Appl. No.: 11/166,508

(22) Filed: Jun. 24, 2005

(65) Prior Publication Data

US 2006/0290422 A1    Dec. 28, 2006

(51) Int. Cl.
*H03F 1/36* (2006.01)
(52) U.S. Cl. .................. 330/86; 330/254; 330/282
(58) Field of Classification Search ............... 330/86, 330/254, 282
See application file for complete search history.

(56) References Cited

U.S. PATENT DOCUMENTS

| | | | | |
|---|---|---|---|---|
| 4,350,959 A | * | 9/1982 | Rosenbaum | ............... 330/110 |
| 5,793,254 A | * | 8/1998 | O'Connor | ................... 330/282 |
| 5,877,612 A | * | 3/1999 | Straw | ......................... 330/254 |
| 6,392,478 B1 | * | 5/2002 | Mulder et al. | ................ 330/86 |
| 6,882,226 B2 | * | 4/2005 | Cho et al. | .................... 330/282 |
| 2003/0123168 A1 | * | 7/2003 | Yokomizo | ................... 359/896 |

* cited by examiner

*Primary Examiner*—Patricia Nguyen
(74) *Attorney, Agent, or Firm*—Fountainhead Law Group PC; Chad R. Walsh

(57) ABSTRACT

In one embodiment, the present invention includes a circuit comprising an amplifier having an input terminal, an output terminal, a positive supply voltage, and a negative supply voltage. The amplifier is configured to have a first gain. A variable feedback circuit is coupled between the input terminal and the output terminal. The difference between the voltage on the output terminal and input terminal is received by the variable feedback circuit, which changes the gain of the circuit and reduces distortion.

18 Claims, 3 Drawing Sheets

VARIABLE FEEDBACK CIRCUITS AND METHODS

BACKGROUND

The present invention relates to circuits, and in particular, to a variable feedback circuit.

FIG. 1 is an example of a prior art amplifier circuit 100. Circuit 100 in this example includes an amplifier 101 having first and second input terminals (e.g., positive and negative inputs) and an output terminal. In this example, amplifier 101 includes a first resistor R1 coupled between an input signal Vin and the first negative input terminal. A second resistor R2 is coupled between the output terminal of the amplifier and the first input terminal. The second positive input terminal is coupled to ground. This amplifier configuration is the commonly-known inverting amplifier. The gain of this stage is given by the following equation:

$$Vout/Vin = -R2/R1.$$

In this example, amplifier 101 is powered by a +5 volt positive supply voltage and a zero volt (i.e., ground) negative supply voltage. Thus, if R2 is ten times the value of R1, then the circuit will have a gain of ten (10). Therefore, if the input signal has a peak-to-peak amplitude of 600 mV, then the output, Vout, should be a signal having a peak-to-peak amplitude of 6V. This example highlights a limitation of non-ideal circuits. In particular, since the positive supply is only 5V, the voltage on the output terminal, Vout, cannot achieve a voltage greater than 5V (typically less for amplifiers that do not have rail-to-rail output swing capability). When the input is sufficiently large in amplitude to cause the voltage on the output to reach the upper and/or lower power supply voltages (i.e., the upper and lower rails), the voltage on the output terminal will increase to the rail and then stop. This is referred to as "clipping." A clipped output signal, Vout, is plotted to the right of the amplifier circuit in FIG. 1. As shown in the plot, the top and bottom of the signal are flat, indicating that the input signal and gain have cause the voltage on the output to reach a maximum value as constrained by the upper and lower rails.

Clipping is problematic in many circuit applications because during the period of time that the signal is clipped, the information contained in the input signal is lost. Clipping is particularly problematic in applications that are sensitive to distortion. For example, in audio applications it is desirable to minimize the amount of amplifier distortion because even the slightest distortion may be discernable to the human ear.

Thus, there is a need to reduce distortion in electronic circuits. The present invention solves these and other problems by providing variable feedback circuits and methods.

SUMMARY

Embodiments of the present invention reduce distortion effects in circuits. In one embodiment the present invention includes a circuit comprising an amplifier having an input terminal, an output terminal, a positive supply voltage, and a negative supply voltage, the amplifier configured to have a first gain, and a variable feedback circuit coupled between the input terminal and the output terminal, wherein if the difference between the voltage on the output terminal and the positive supply voltage is less than a predetermined value, then the variable feedback circuit reconfigures the amplifier to have a second gain less than the first gain, and if the difference between the voltage on the output terminal and the negative supply voltage is less than a predetermined value, then the variable feedback circuit reconfigures the amplifier to have a third gain less than the first gain.

In one embodiment, the variable feedback circuit comprises a comparison circuit.

In another embodiment, the comparison circuit compares the voltage on the output terminal to the voltage on the input terminal and activates a first current path between the output terminal and the input terminal when the voltage difference between the output terminal and input terminal is positive and greater than a predetermined value.

In another embodiment, the comparison circuit compares the voltage on the output terminal to the voltage on the input terminal and activates a second current path between the output terminal and the input terminal when the voltage difference between the output terminal and input terminal is negative and greater than a predetermined value.

In one particular embodiment, the variable feedback circuit comprises a resistor and at least one transistor.

In another embodiment, the variable feedback circuit comprises a first transistor having a first terminal coupled to the output terminal, a second terminal coupled to the input terminal through a first resistor, and a control terminal coupled to a first reference voltage, and a second transistor having a first terminal coupled to the output terminal, a second terminal coupled to the input terminal through the first resistor, and a control terminal coupled to a second reference voltage.

In one embodiment, the first and second transistors are bipolar transistors.

In another embodiment, the amplifier includes a third resistor having a first terminal coupled to the input terminal and a second terminal coupled to an input signal, and a fourth resistor coupled between the amplifier input terminal and output terminal, wherein the amplifier further comprises a second terminal coupled to ground, and wherein the first transistor is coupled to a first intermittent node in a plurality of series connected resistors coupled between the positive supply voltage and the negative supply voltage, and the second transistor is coupled to a second intermittent node in said plurality of series connected resistors.

In one embodiment, the variable feedback circuit comprises means for coupling a resistor between the output terminal and input terminal if the voltage difference between the output terminal and input terminal is positive and greater than a first predetermined value and if the voltage difference between the output terminal and input terminal is negative and greater than a second predetermined value.

Alternatively, embodiments of the present invention include circuit comprising an amplifier having an first and second input terminals, an output terminal, a positive supply voltage, and a negative supply voltage, a first resistor coupled between the output terminal and the first input terminal, a first transistor having a first terminal, a second terminal, and a control terminal, wherein the first terminal of the first transistor is coupled to the output terminal of the amplifier and the control terminal is coupled to a first reference voltage, and a second resistor coupled between the second terminal of the first transistor and the first input terminal of the amplifier. In one embodiment, the first reference voltage is configured so that the first transistor conducts current between the output terminal of the amplifier and the second resistor when the difference between the voltage on the output terminal of the amplifier and the voltage on the input terminal of the amplifier is positive and greater than a predetermined value. In another embodiment, the circuit further comprises a second transistor having a first terminal, a second terminal, and a control terminal, wherein the first terminal of the second transistor is coupled to the output terminal of the amplifier, the control terminal of the second transistor is coupled to a second reference voltage, and the first terminal of the second transistor is coupled to the second resistor. In another embodiment, the second reference voltage is configured so that the second transistor conducts current between the output terminal of the amplifier and the second resistor when the difference between the voltage on the output terminal of the amplifier and the voltage on the input terminal of the amplifier is negative and greater than a predetermined value. In yet another embodiment, the circuit further comprises at least three resistors coupled in series between a positive supply voltage and a negative supply voltage, wherein a first intermittent node between a first two of said at least three resistors is coupled to the control terminal of the first transistor, and wherein a second intermittent node between a second two of said at least three resistors is coupled to the control terminal of the second transistor.

Alternatively, embodiments of the present invention include an amplifier method comprising configuring said amplifier in a first gain, and reconfiguring said amplifier to have a second gain less than the first gain if the difference between the voltage on an output terminal of said amplifier and a positive supply voltage for said amplifier is less than a first predetermined value or if the difference between the voltage on the output terminal of said amplifier and a negative supply voltage is less than a second predetermined value. In one embodiment, reconfiguring comprises activating a first current path including a resistor between the output terminal of said amplifier and the input terminal of said amplifier when the voltage difference between the output terminal and input terminal is positive and greater than a third predetermined value. In one embodiment, reconfiguring comprises activating a second current path including the resistor between the output terminal of said amplifier and the input terminal of said amplifier when the voltage difference between the output terminal and input terminal is negative and greater than a fourth predetermined value. In one embodiment, the first current path is through a first transistor, and the second current path is through a second transistor. In one specific embodiment, the first transistor is a PNP transistor and the second transistor is a NPN transistor. However it is to be understood that other transistors could be used.

The following detailed description and accompanying drawings provide a better understanding of the nature and advantages of the present invention.

DETAILED DESCRIPTION

Described herein are variable feedback circuits and methods. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include obvious modifications and equivalents of the features and concepts described herein.

Figure 1:
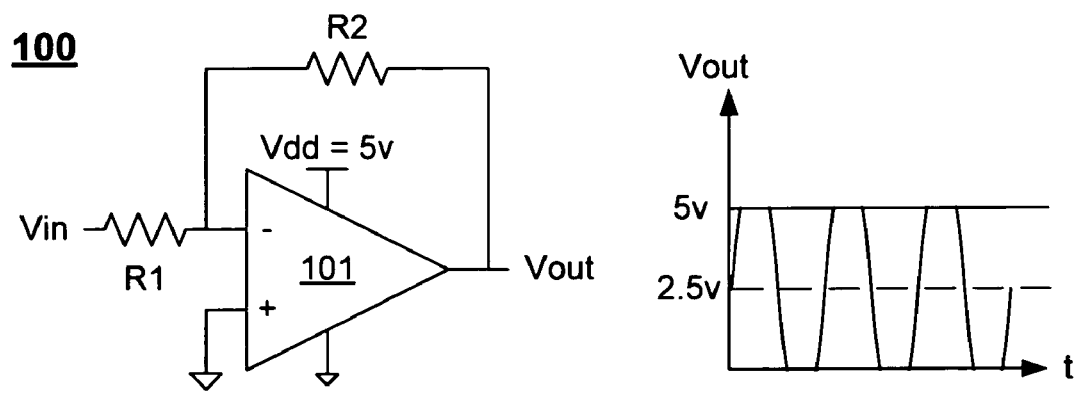
FIG. 1 is an example of a prior art amplifier.
Figure 2:
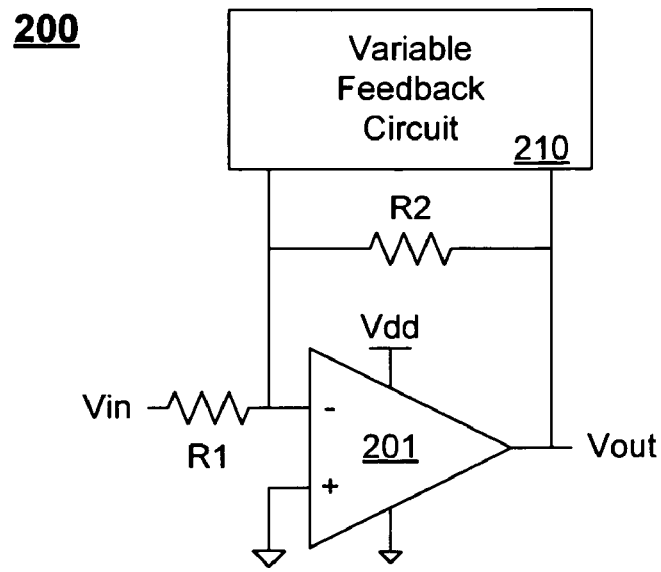
FIG. 2 is an example of a circuit according to one embodiment of the present invention.

FIG. 2 is an example of a circuit according to one embodiment of the present invention. Circuit 200 includes an amplifier 201 configured as an inverting amplifier. The inverting amplifier is used throughout this specification to illustrate the drawbacks of the prior art and advantages of the different embodiments of the present invention. However, it is to be understood that other single-ended or differential feedback amplifier configurations could use the techniques described herein. Amplifier 201 includes first and second input terminals (e.g., positive and negative inputs) and an output terminal. In this example, amplifier 201 includes a first resistor R1 coupled between an input signal Vin and the first negative input terminal. A second resistor R2 is coupled between the output terminal of the amplifier and the first input terminal. The second positive input terminal is coupled to ground. A variable feedback circuit 210 is coupled between the input terminal and the output terminal. As mentioned above, the gain of this stage is given by the following equation:

$$Vout/Vin = -R2/R1.$$

In this example, amplifier 201 is powered by a positive supply voltage Vdd and a negative supply voltage, which in this example is ground. It is to be understood that a variety of voltages could be used as the positive and negative supplies.

Variable feedback circuit operates to reduce the gain of the circuit when the voltage on the output terminal is within some predetermined range of the positive or negative supply voltages. For instance, if the difference between the voltage on the amplifier output terminal and the positive supply voltage is less than a predetermined value, then the variable feedback circuit reconfigures the amplifier to have a second gain less than the first gain. Accordingly, as an input signal is amplified and causes the output voltage to increase in the positive direction close to the upper rail, the gain may be automatically reduced so that the output will not clip. Similarly, if the difference between the voltage on the output terminal and the negative supply voltage is less than a predetermined value, then the variable feedback circuit reconfigures the amplifier to have a gain less than the first gain. Accordingly, as an input signal is amplified and causes the output voltage to decrease close to the lower rail (or move generally in the negative direction close to a negative rail), then the gain may be automatically reduced so that the output will not clip. The gain of the reconfigured circuit may be the same or different when near the positive or negative supply voltages.

Accordingly, circuit 200 is also an example of an amplifier method comprising configuring said amplifier in a first gain, and reconfiguring said amplifier to have a second gain less than the first gain if the difference between the voltage on an output terminal of said amplifier and a positive supply voltage for said amplifier is less than a first predetermined value or if the difference between the voltage on the output terminal of said amplifier and a negative supply voltage is less than a second predetermined value. The predetermined values may be particular voltages that are selected as a matter of design choice. In some embodiments, the first and second predetermined values may be designed to be approximately the same.

In one embodiment, variable feedback circuit 210 may include a plurality of current paths. Accordingly, reconfiguring the circuit may include activating a first current path between the output terminal of said amplifier and the input terminal of said amplifier when the voltage difference between the output terminal and input terminal is positive and greater than another predetermined value. Since the current path is between the output terminal and the input terminal of the amplifier, such current path is another feedback path. If a resistor is placed in this feedback path, for example, the gain of the circuit may be modified. In one embodiment, reconfiguring comprises activating a second current path including a resistor between the output terminal of said amplifier and the input terminal of said amplifier when the voltage difference between the output terminal and input terminal is negative and greater than a fourth predetermined value.

Figure 3:
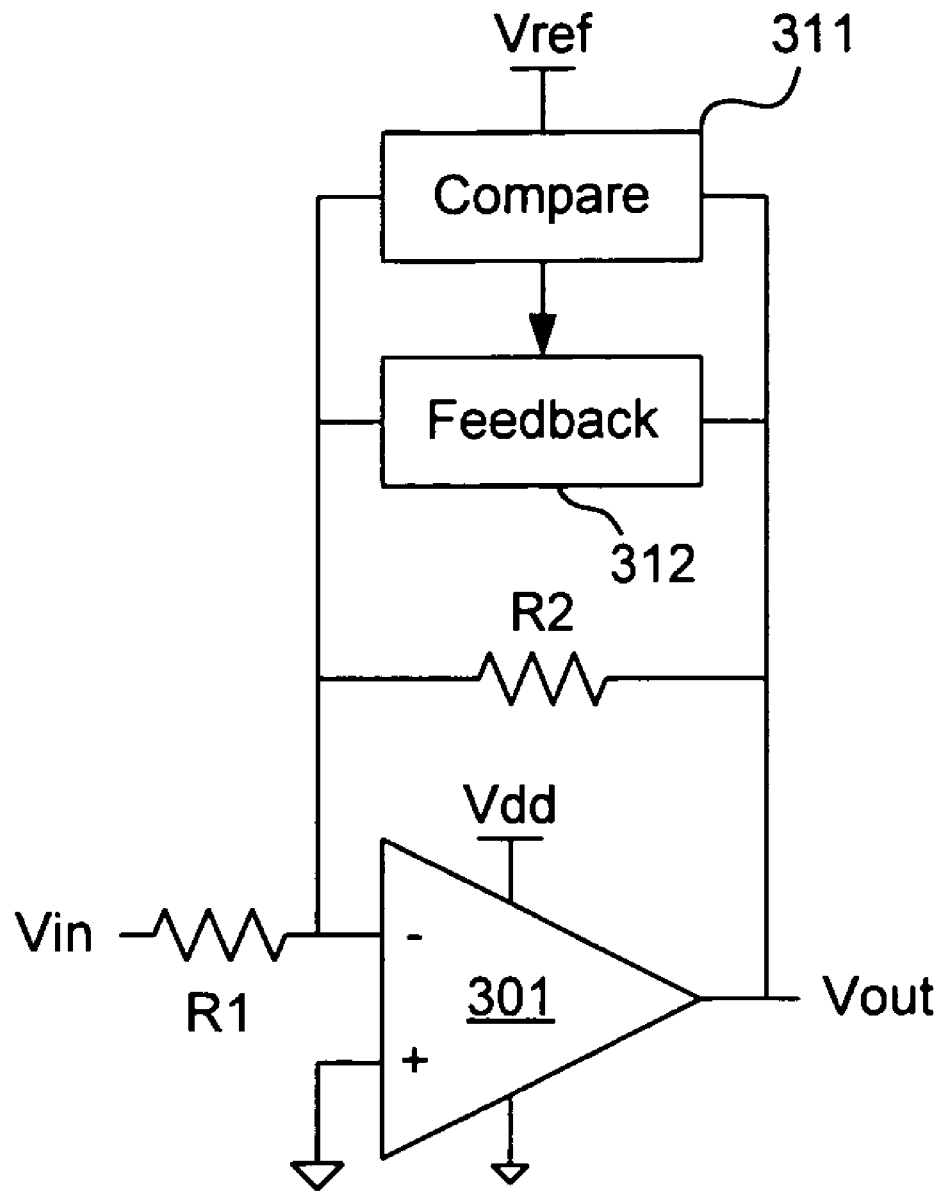
FIG. 3 is an example of a circuit according to another embodiment of the present invention.

FIG. 3 is an example of a circuit according to another embodiment of the present invention. In one embodiment, the variable feedback circuit comprises a comparison circuit 311 and feedback circuit 312. Comparison circuit 311 and feedback circuit 312 are coupled between the output terminal and input terminal of amplifier 301. Comparison circuit 311 may receive a reference voltage Vref. Feedback circuit 312 may include one or more current feedback paths that are activated by comparison circuit 311. For example, comparison circuit 311 may compare the voltage on the output terminal to the voltage on the input terminal and activate a current path between the output terminal and the input terminal when the voltage difference between the output terminal and input terminal is positive and greater than a predetermined value. In another embodiment, comparison circuit 311 may compare the voltage on the output terminal to the voltage on the input terminal and activate a current path between the output terminal and the input terminal when the voltage difference between the output terminal and input terminal is negative and greater than a predetermined value. In one particular embodiment, the feedback circuit includes a resistor that is used to change the gain of the circuit.

Figure 4:
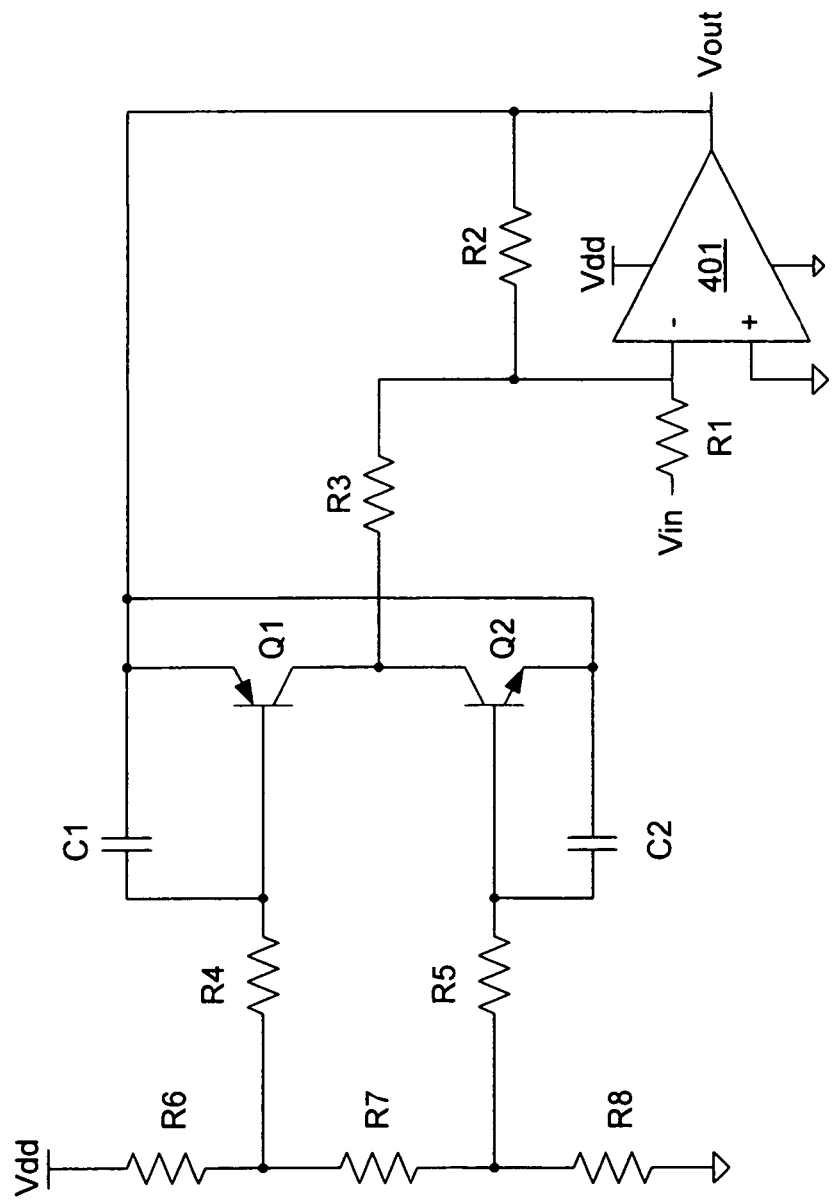
FIG. 4 is a specific example of a circuit according to one embodiment of the present invention.

FIG. 4 is a specific example of a circuit 400 according to one embodiment of the present invention. In this example, circuit 400 includes an amplifier 401 including a resistor R1 having a first terminal coupled to the input terminal (here, the negative input) and a second terminal coupled to an input signal, Vin. Another resistor R2 is coupled between the amplifier input terminal and output terminal. Amplifier 401 further includes a second terminal (here, the positive input) coupled to a reference voltage, which in this example is ground. Amplifier 401 is powered by positive supply voltage Vdd and a negative supply voltage, which in this case is ground.

In this example, a variable feedback circuit is coupled to opposite terminals of R2. The circuit shown illustrates a means for coupling a resistor between the output terminal and input terminal of an amplifier if the voltage difference between the output terminal and input terminal is positive and greater than a first predetermined value, or if the voltage difference between the output terminal and input terminal is negative and greater than a second predetermined value. In this example, the variable feedback circuit comprises a transistor Q1 having a first terminal coupled to the output terminal of amplifier 401, a second terminal coupled to the input terminal of amplifier 401 through a resistor R3, and a control terminal coupled to a first reference voltage through a resistor R4. The circuit further includes a second transistor Q2 having a first terminal coupled to the output terminal of amplifier 401, a second terminal coupled to the input terminal through resistor R3, and a control terminal coupled to a second reference voltage through resistor R5. In this example, transistor Q1 is a PNP bipolar transistors and transistor Q2 is an NPN bipolar transistor. However, it is to be understood that other devices such as MOS, for example, could be used.

The reference voltages for Q1 and Q2 are generated by series resistors R6, R7, and R8, which are coupled between positive supply voltage, Vdd, and negative supply voltage (here, ground). A first intermittent node between resistors R6 and R7 is coupled to the control terminal transistor Q1. Similarly, a second intermittent node between resistors R7 and R8 is coupled to the control terminal of transistor Q2. These reference voltages set the trip points for the comparison function of the circuit. Capacitors C1 and C2 may be included between the emitters of Q1 and Q2 to shunt high frequencies.

In one embodiment, the first reference voltage is configured so that transistor Q1 conducts current between the output terminal of the amplifier and resistor R3 when the difference between the voltage on the output terminal of the amplifier and the voltage on the input terminal of the amplifier is positive and greater than a predetermined value. For example, if Vdd is 5 volts, and the voltage at the intermittent node between R6 and R7 is 80% of Vdd (i.e., 4 volts), then as the voltage on the output terminal of amplifier 401 increases above 4 volts, Q1 will start to turn on. In particular, as Vout approaches 5 volts, and the base-emitter voltage increases above the turn-on voltage of Q1, Q1 will conduct current from the output of amplifier 401 through resistor R3 and back to the input of amplifier 401. Accordingly, R3 will now be in parallel with R2, and the gain of the circuit will be reduced. The values of R1, R2, and R3 can be selected by design choice to activate the variable feedback circuit at any desired difference between the output and the supply. A variety of resistor values may be selected for R1, R2, and R3 resulting in a variety of gains and gain changes when the variable feedback circuit is active or inactive. Similarly, the second reference voltage is configured so that transistor conducts Q2 current between the output terminal of the amplifier and resistor R3 when the difference between the voltage on the output terminal of the amplifier and the voltage on the input terminal of the amplifier is negative and greater than a predetermined value.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims. The terms and expressions that have been employed here are used to describe the various embodiments and examples. These terms and expressions are not to be construed as excluding equivalents of the features shown and described, or portions thereof, it being recognized that various modifications are possible within the scope of the appended claims.

What is claimed is:

1. A circuit comprising:
an amplifier having an input terminal, an output terminal, a positive supply voltage, and a negative supply voltage, the amplifier configured to have a first gain; and
a variable feedback circuit coupled between the input terminal and the output terminal,
wherein if the difference between the voltage on the output terminal and the positive supply voltage is less than a predetermined value, then the variable feedback circuit reconfigures the amplifier to have a second gain less than the first gain, and if the difference between the voltage on the output terminal and the negative supply voltage is less than a predetermined value, then the variable feedback circuit reconfigures the amplifier to have a third gain less than the first gain.

2. The circuit of claim 1 wherein the variable feedback circuit comprises a comparison circuit.

3. The circuit of claim 2 wherein the comparison circuit compares the voltage on the output terminal to the voltage on the input terminal and activates a first current path between the output terminal and the input terminal when the voltage difference between the output terminal and input terminal is positive and greater than a predetermined value.

4. The circuit of claim 2 wherein the comparison circuit compares the voltage on the output terminal to the voltage on the input terminal and activates a second current path between the output terminal and the input terminal when the voltage difference between the output terminal and input terminal is negative and greater than a predetermined value.

5. The circuit of claim 1 wherein the variable feedback circuit comprises: a feedback circuit.

6. The circuit of claim 5 wherein the variable feedback circuit comprises a resistor and at least one transistor.

7. The circuit of claim 1 wherein the variable feedback circuit comprises:
a first transistor having a first terminal coupled to the output terminal, a second terminal coupled to the input terminal through a first resistor, and a control terminal coupled to a first reference voltage; and
a second transistor having a first terminal coupled to the output terminal, a second terminal coupled to the input terminal through the first resistor, and a control terminal coupled to a second reference voltage.

8. The circuit of claim 7 wherein the first and second transistors are bipolar transistors.

9. The circuit of claim 7 wherein the amplifier includes a third resistor having a first terminal coupled to the input terminal and a second terminal coupled to an input signal, and a fourth resistor coupled between the amplifier input terminal and output terminal, wherein the amplifier further comprises a second terminal coupled to ground, and wherein the first transistor is coupled to a first intermittent node in a plurality of series connected resistors coupled between the positive supply voltage and the negative supply voltage, and the second transistor is coupled to a second intermittent node in said plurality of series connected resistors.

10. The circuit of claim 1 wherein the variable feedback circuit comprises means for coupling a resistor between the output terminal and input terminal if the voltage difference between the output terminal and input terminal is positive and greater than a first predetermined value or if the voltage difference between the output terminal and input terminal is negative and greater than a second predetermined value.

11. A circuit comprising:
an amplifier having a first and second input terminals, an output terminal, a positive supply voltage, and a negative supply voltage;
a first resistor coupled between the output terminal and the first input terminal;
a first transistor having a first terminal, a second terminal, and a control terminal, wherein the first terminal of the first transistor is coupled to the outPut terminal of the amplifier and the control terminal is coupled to a first reference voltage; and
a second resistor coupled between the second terminal of the first transistor and the first input terminal of the amplifier, wherein the first reference voltage is configured so that the first transistor conducts current between the output terminal of the amplifier and the second resistor when the difference between the voltage on the output terminal of the amplifier and the voltage on the input terminal of the amplifier is positive and greater than a predetermined value.

12. A circuit comprising:
an amplifier having a first and second input terminals, an output terminal, a positive supply voltage, and a negative supply voltage;
a first resistor coupled between the output terminal and the first input terminal;
a first transistor having a first terminal a second terminal, and a control terminal, wherein the first terminal of the first transistor is coupled to the output terminal of the amplifier and the control terminal is coupled to a first reference voltage;
a second resistor coupled between the second terminal of the first transistor and the first input terminal of the amplifier; and
a second transistor having a first terminal, a second terminal, and a control terminal, wherein the first terminal of the second transistor is coupled to the output terminal of the amplifier, the control terminal of the second transistor is coupled to a second reference voltage, and the second terminal of the second transistor is coupled to the second resistor, wherein the second reference voltage is configured so that the second transistor conducts current between the output terminal of the amplifier and the second resistor when the difference between the voltage on the output terminal of the amplifier and the voltage on the input terminal of the amplifier is negative and greater than a predetermined value.

13. A circuit comprising:
an amplifier having an first and second input terminals, an output terminal, a positive supply voltage, and a negative supply voltage;
a first resistor coupled between the output terminal and the first input terminal;
a first transistor having a first terminal, a second terminal, and a control terminal, wherein the first terminal of the first transistor is coupled to the output terminal of the amplifier and the control terminal is coupled to a first reference voltage;
a second resistor coupled between the second terminal of the first transistor and the first input terminal of the amplifier; and
at least three resistors coupled in series between a positive supply voltage and a negative supply voltage, wherein a first intermittent node between a first two of said at least three resistors is coupled to the control terminal of the first transistor, and wherein a second intermittent node between a second two of said at least three resistors is coupled to the control terminal of the second transistor.

14. An amplifier method comprising:

configuring said amplifier in a first gain; and reconfiguring said amplifier to have a second gain less than the first gain if the difference between the voltage on an output terminal of said amplifier and a positive supply voltage for said amplifier is less than a first predetermined value or if the difference between the voltage on the output terminal of said amplifier and a negative supply voltage is less than a second predetermined value.

15. The method of claim 14 wherein reconfiguring comprises activating a first current path including a resistor between the output terminal of said amplifier and the input terminal of said amplifier when the voltage difference between the output terminal and input terminal is positive and greater than a third predetermined value.

16. The method of claim 15 wherein reconfiguring comprises activating a second current path including the resistor between the output terminal of said amplifier and the input terminal of said amplifier when the voltage difference between the output terminal and input terminal is negative and greater than a fourth predetermined value.

17. The method of claim 16 wherein the first current path is through a first transistor, and wherein the second current path is through a second transistor.

18. The method of claim 17 wherein first transistor is a PNP transistor and the second transistor is a NPN transistor.

* * * * *